United States Patent [19]

Freuler et al.

[11] Patent Number: 5,030,919

[45] Date of Patent: Jul. 9, 1991

[54] ZERO IMPEDANCE SWITCH

[75] Inventors: George H. Freuler, Morena Valley; Edward J. Collier, Anaheim; George J. Wasemiller, Encinitas, all of Calif.

[73] Assignee: G&E Test Technologies, Inc., Yorba Linda, Calif.

[21] Appl. No.: 532,378

[22] Filed: Jun. 4, 1990

[51] Int. Cl.⁵ ............................................. G01R 27/08
[52] U.S. Cl. ..................................... 324/720; 324/602; 324/649
[58] Field of Search ............... 324/649, 650, 653, 691, 324/720, 722, 602, 415

[56] References Cited

U.S. PATENT DOCUMENTS

| | | | |
|---|---|---|---|
| 3,449,666 | 6/1969 | Plice | 324/649 |
| 4,242,631 | 12/1980 | Hall | 324/649 |
| 4,634,975 | 1/1987 | Eccleston et al. | 324/243 X |
| 4,961,051 | 10/1990 | Tjebben | 324/415 |

Primary Examiner—Kenneth A. Wieder
Assistant Examiner—Robert W. Mueller
Attorney, Agent, or Firm—Gordon L. Peterson; Harry G. Weissenberger

[57] ABSTRACT

In a switchable impedance tester for measuring very small impedances, the effect of switch impedances is eliminated by connecting the test load between two switching transistors in their emitter-collector circuit, and driving them with operational amplifiers arranged to urge their inputs into equality. A test voltage source is connected across first inputs of the amplifiers, and the other inputs are connected between the respective transistors and the load. This produces an operational condition in which the voltage across the load is independent of the parameters of the switching transistors, i.e. the switching transistors appear to have zero impedance.

4 Claims, 1 Drawing Sheet

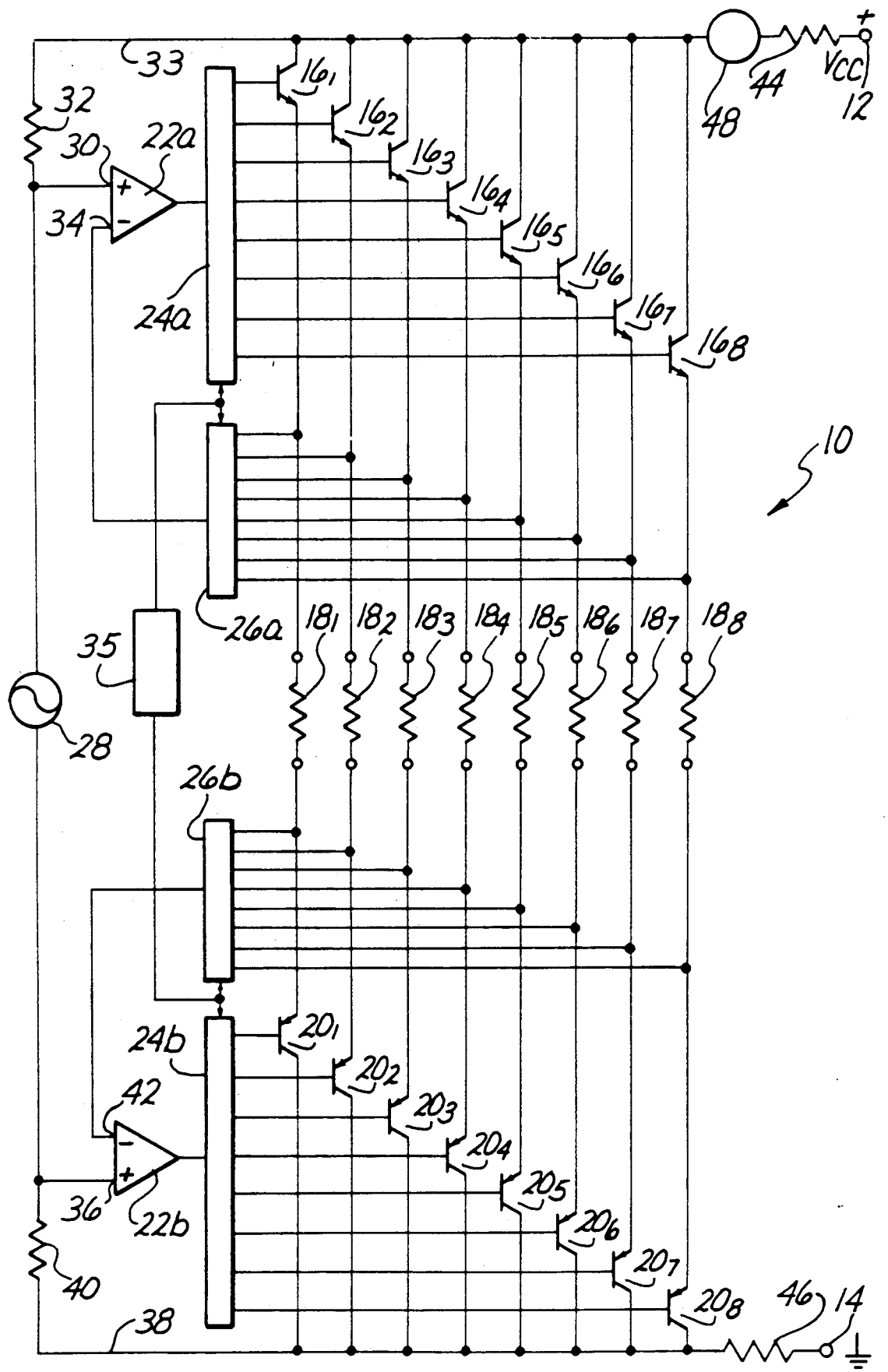

ZERO IMPEDANCE SWITCH

FIELD OF THE INVENTION

This invention relates to equipment requiring low-impedance electrical circuits, and more particularly to a zero effective impedance switch.

BACKGROUND OF THE INVENTION

In the telecommunications industry and other applications, it is often necessary to test circuits having a very low impedance. Such tests are conventionally performed by computers which selectively activate test connections to the equipment by means of electronic switches. Unfortunately, the impedance of the switch itself becomes a significant factor in this type of test when the impedance to be tested is very low.

Two types of test circuitry are conventionally used for this purpose. In one type, computer-operated drivers actuate reed switches. These have a very low impedance (on the order of $2\Omega$) but have a deteriorating life in which their impedance gradually increases. In the other type, semiconductor switches are used to directly close the measuring circuit. These devices have unpredictable impedances varying in a range on the order of 60-200$\Omega$, and they are usually unable to handle much current. Specialized semiconductor switches can bring the switch impedance down to the order of less than 25$\Omega$, but this requires current levels on the order of 50A, which may be impractical.

Conventionally, these problems are solved by matching the semiconductor devices and using compensating circuits or bridges for nulling the effect of the switch impedance. Both of these solutions, however, are expensive and not entirely satisfactory.

SUMMARY OF THE INVENTION

The invention solves the switch impedance problem, and thereby allows the rapid and accurate measurement of impedances as low as 0.01$\Omega$, by providing a switchable test circuit in which the test current through the impedance to be tested is independent of the parameters of the switching circuitry; in other words, the switch appears to the test equipment to have zero impedance.

The appearance of zero impedance is accomplished by driving the switching transistors with operational amplifiers cooperating with feedback loops and a separate test voltage source to maintain across the load being tested a known voltage that is independent of switch impedance.

BRIEF DESCRIPTION OF THE DRAWINGS

The single figure of the drawing is a circuit diagram, partly in block form, of a test apparatus using the invention.

DESCRIPTION OF THE PREFERRED EMBODIMENT

The test device 10 shown in the drawing includes a DC source providing a reference voltage $V_{cc}$ between terminals 12 and 14, a plurality (e.g. 8) of n-p-n switching transistors $16_1$ through $16_8$, a like plurality of load impedances $18_1$ through $18_8$ to be selectively measured, a like plurality of p-n-p switching transistors $20_1$ through $20_8$, a pair of operational amplifiers (op amps) 22a, 22b, a pair of switching multiplexers 24a, 24b, a pair of feedback multiplexers 26a, 26b, and a (preferably AC) test voltage source 28 of of voltage $\epsilon$. The peak-to-peak voltage of the test voltage source 28 should not exceed $V_{cc}$.

The op amps 22a and 22b (which may be TL061 chips) are so configured as to attempt to keep their positive (i.e. direct) and negative (i.e. inverted) input voltages equal. The direct input 30 of op amp 22a is connected through an isolating and anti-oscillating resistor 32 (e.g. 1 M$\Omega$) to the collectors of switching transistor $16_1$ through $16_8$, and also to one side of the test voltage source 28.

The inverted input 34 is connected through multiplexer 26a (which, like the other multiplexers, may be a 4051 chip) to the emitter of whichever one of transistors $16_1$ through $16_8$ has been turned on by the output of op amp 22a through the multiplexer 24a. The multiplexers 24a, 24b, 26a and 26b are concurrently controlled by a selection signal which may be generated by a microprocessor 35.

Similarly, the inverted input 36 to op amp 22b is connected to bus 38 through an isolating resistor 40 identical to resistor 32, and the direct input 42 of op amp 22b is connected through multiplexer 26b to the emitter of the selected one of switching transistor $20_1$ through $20_8$.

With these connections, it will be seen that if the voltage between buses 33 and 38 is E volts, and the interval impedance of voltage source 28 is negligible with respect to that of resistors 32 and 40, the potential at the direct input of op amp 22a $(E+\epsilon)/2$, while the potential at the inverted input of op amp 22b is $(E-\epsilon)/2$, the test voltage source 28 acting as a virtual ground.

Inasmuch as the inverted input 34 of op amp 22a tracks its direct input 30, and the direct input 42 of op amp 22b tracks its inverted input 36, it will be seen that the voltage across the load impedance being measured is $(E+\epsilon)/2-(E-\epsilon)/2$, or $\epsilon$. Consequently, the load current $i_j$ through a load impedance Z under test is always $i_j=\epsilon/Z_j$, and is independent of any impedances in the switching circuitry; in other words, the switching circuitry appears to the load to have zero impedance.

The resistors 44, 46 (e.g. 10$\Omega$) are current limiting resistors to prevent circuit damage in case the load under test is short-circuited. Their effect is constant and can be accounted for in calibrating the test apparatus.

In operation, the op amps 22a, 22b turn on the selected ones of the switching transistors $16_1$ through $16_8$ and $20_1$ through $20_8$ to the extent necessary to obtain the above-described voltage relationships. The current $i_j$ drawn by the selected load impedance can be sensed by an appropriate current sensing device 48, and the load impedance under test can then be calculated from the known values of $i_j$ and $\epsilon$.

Because the input impedance of op amps 22a, 22b is in the hundreds of megohms, the feedback circuits going into the op amp inputs 34, 42 draw essentially no current.

Although the test voltage source 28 can be DC for resistance measurements, it is preferably AC in order to not only measure impedance at relevant frequencies, but also ascertain whether the impedance of the load varies with polarity.

We claim:

1. A circuit for eliminating the effect of switching impedance in electronic measuring apparatus or the like, comprising:

(a) a reference voltage source;

(b) a load whose impedance is to be measured; and
(c) a pair of switching transistors, one of said pair being a p-n-p transistor and the other an n-p-n transistor, said load being connected in series with the emitter-collector circuits of said transistors and between them, and said emitter-collector circuits and load being connected in series with said reference voltage source;
(d) a pair of operational amplifiers each arranged to urge its inputs into equality, the output of each of said operational amplifiers being operatively connected to drive one of said transistors;
(e) means for operatively connecting a first input of each of said operational amplifiers to the emitter-collector circuit of the transistor driven by it, between said transistor and said reference voltage source;
(f) means for operatively connecting a second input of each of said operational amplifiers to the emitter-collector circuit of the transistor driven by it, between said transistor and said load; and
(g) a test voltage source connected across said first inputs of said operational amplifiers.

2. The circuit of claim 1, in which said first input connecting means include isolating resistor means.

3. The circuit of claim 1, further comprising:
(h) a plurality of sets of series-connected p-n-p transistors, loads, and n-p-n transistors, said sets being connected in parallel with each other and in series with said reference voltage source;
(i) multiplexer means for selectively operatively connecting said operational amplifier outputs and said second inputs to the transistors and circuit of a selected one of said sets; and
(j) selection means for actuating said multiplexer means.

4. The circuit of claim 1, in which said reference voltage source is DC, and said test voltage source is AC.

* * * * *